United States Patent
Carducci

[19]

[11] Patent Number: 6,132,165
[45] Date of Patent: Oct. 17, 2000

[54] SINGLE DRIVE, DUAL PLANE ROBOT

[75] Inventor: Jim Carducci, Sunnyvale, Calif.

[73] Assignee: Applied Materials, Inc., Santa Clara, Calif.

[21] Appl. No.: 09/028,448

[22] Filed: Feb. 23, 1998

[51] Int. Cl.[7] .................................................. B25J 18/04
[52] U.S. Cl. ..................... 414/744.5; 414/917; 901/15
[58] Field of Search .............................. 414/744.5, 744.6, 414/917; 901/15; 74/490.01, 490.09, 490.03

[56] References Cited

U.S. PATENT DOCUMENTS

| | | | |
|---|---|---|---|
| 4,712,971 | 12/1987 | Fyler ................................... | 414/744 R |
| 4,775,281 | 10/1988 | Prentakis ............................. | 414/416 |
| 4,897,015 | 1/1990 | Abbe et al. ......................... | 414/744.8 |
| 4,923,054 | 5/1990 | Ohtani et al. ...................... | 187/25 |
| 4,951,601 | 8/1990 | Maydan et al. .................... | 118/719 |
| 4,990,047 | 2/1991 | Wagner et al. ..................... | 414/217 |
| 5,100,502 | 3/1992 | Murdoch et al. .................. | 156/643 |
| 5,102,280 | 4/1992 | Produje et al. ..................... | 414/225 |
| 5,147,175 | 9/1992 | Tada ................................... | 414/749 |
| 5,151,008 | 9/1992 | Ishida et al. ....................... | 414/744.5 |
| 5,180,276 | 1/1993 | Hendrickson ..................... | 414/752 |
| 5,227,708 | 7/1993 | Lowrance . | |
| 5,270,600 | 12/1993 | Hashimoto ........................ | 310/75 D |
| 5,324,155 | 6/1994 | Goodwin et al. .................. | 414/225 |
| 5,364,222 | 11/1994 | Akimoto et al. .................. | 414/416 |
| 5,404,894 | 4/1995 | Shiraiwa ............................ | 134/66 |
| 5,439,547 | 8/1995 | Kumagai ............................ | 156/345 |
| 5,447,409 | 9/1995 | Grunes et al. ..................... | 414/744.6 |
| 5,522,275 | 6/1996 | Mauletti ............................. | 74/490.03 |
| 5,562,387 | 10/1996 | Ishii et al. .......................... | 414/416 |
| 5,564,889 | 10/1996 | Araki ................................. | 414/786 |
| 5,626,456 | 5/1997 | Nishi ................................. | 414/404 |
| 5,636,963 | 6/1997 | Haraguchi et al. ................ | 414/786 |
| 5,647,626 | 7/1997 | Chen et al. ........................ | 294/87.1 |
| 5,647,724 | 7/1997 | Davis, Jr. et al. . | |
| 5,711,646 | 1/1998 | Ueda et al. ........................ | 414/225 |
| 5,789,878 | 8/1998 | Kroeker et al. ................... | 318/45 |
| 5,833,288 | 11/1998 | Itasaka .............................. | 294/64.1 |

FOREIGN PATENT DOCUMENTS

| | | | |
|---|---|---|---|
| 0 742 084 A2 | 11/1996 | European Pat. Off. ........... | B25J 9/10 |
| 0 742 084 A3 | 11/1996 | European Pat. Off. ........... | B25J 9/10 |
| WO 97/35690 | 10/1997 | Japan ............................... | B25J 9/06 |

Primary Examiner—Donald W. Underwood
Attorney, Agent, or Firm—Thomason Moser Patterson

[57] ABSTRACT

The present invention provides a robot and a method of using the robot for transferring objects, namely substrates, through a process system. The robot provides a pair of movable arms mounted to a drive member adapted to move the arms in a rotational path to produce coordinated movements of extension, retraction, and rotation. A pair of upper struts pivotally mounted to the arms at one end pivotally connect to a first blade at their apogee ends to form a frog-leg type assembly. Likewise, a pair of lower struts pivotally mounted to the arms at one end pivotally connect to a second blade, which is radially aligned with the first blade, at their apogee ends to form a frog-leg type assembly. The pivotal connection of the upper struts to the arms are offset from the pivotal connections of the lower struts to the arms to produce a different rate of radial movement of the first blade to the second blade during extension and retraction of the blades. The robot facilitates substrate transfers, such as removal of a processed substrate and insertion of an unprocessed substrate within a processing chamber through a single entry of the robot blades into the processing chamber.

16 Claims, 14 Drawing Sheets

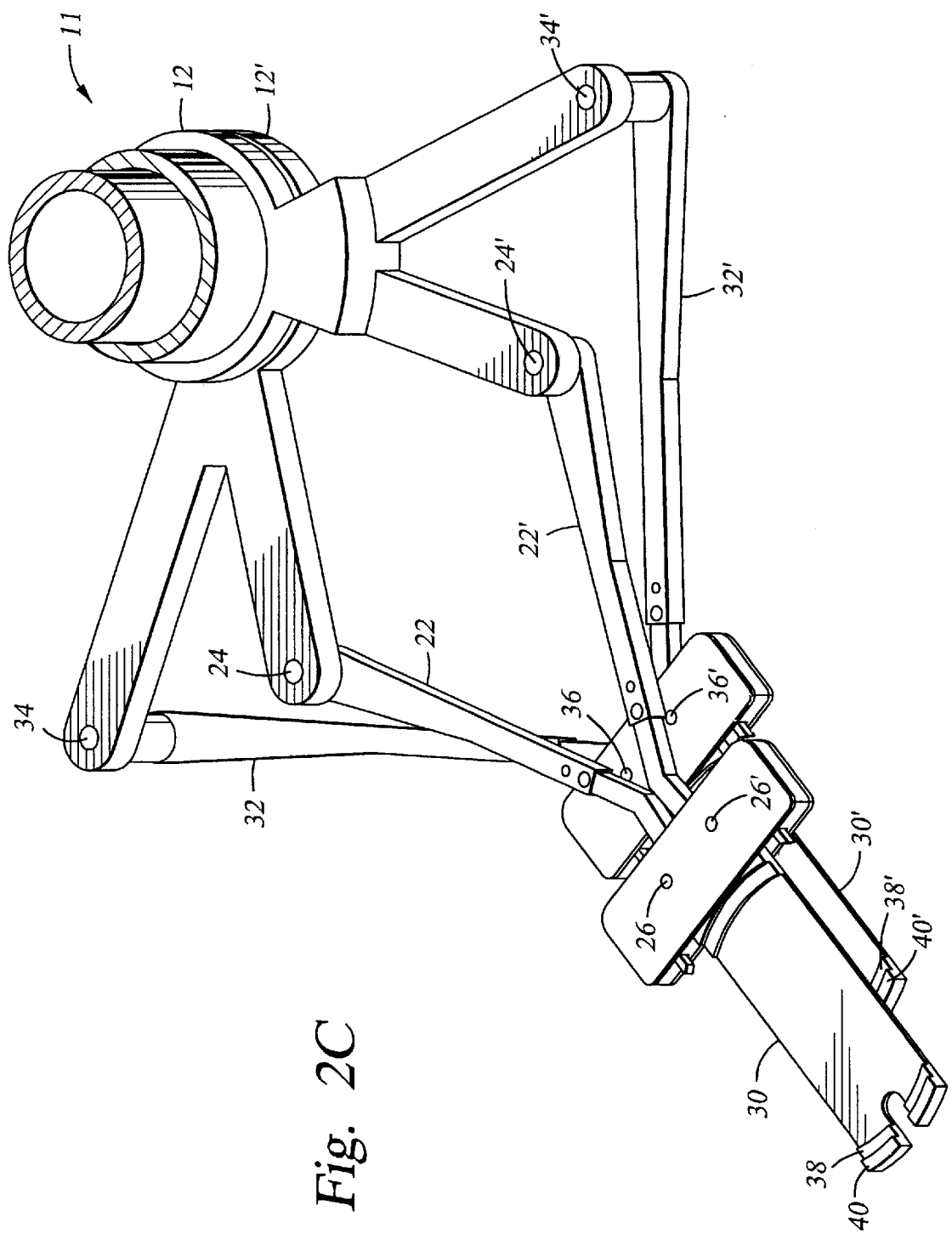

SINGLE DRIVE, DUAL PLANE ROBOT

BACKGROUND OF THE INVENTION

1. Field of the Invention

The present invention relates to an apparatus for transferring objects in a processing system. More particularly, the present invention relates to a robot for effecting substrate exchange using a single stroke and multiple extended positions of the robot.

2. Background of the Related Art

The advantages of using robots in the production of integrated circuits to transfer substrates through a processing system are well established. Current practice includes the use of a robot disposed in a central transfer chamber to move substrates from a loading port into various chambers mounted on the transfer chamber. Various robot designs, including frog-leg type and single-arm type, are currently employed in commercial processing systems. Typically, a robot blade having a substrate supporting surface is attached to the end of a pair of robot arms to provide a substrate supporting surface to carry the substrate through the processing system. The robot arm can retrieve a substrate from a particular chamber, such as a load lock chamber, and shuttle the substrate into another chamber, such as a processing chamber. When substrate processing is complete, the robot arm retrieves the substrate from the processing chamber and returns the substrate to the load lock chamber and another substrate is then moved into the processing chamber. Typically, several substrates are handled in this manner during each process run, and several substrates are passed through the system during a single process cycle.

In multiple chamber process systems, it is desirable to increase the substrate throughput of the system by concurrently processing substrates in each of the chambers. A typical substrate handling sequence used in multiple chamber processing systems includes removing a substrate from a process chamber, moving the substrate to the next processing chamber or storing the substrate in a selected location, and then moving a new substrate from a storage location into the processing chamber from which the first substrate was removed. In this sequence of robot movements, the robot arm itself goes through significant repetitive rotations, extensions and retractions to simply exchange substrates within a selected chamber.

To increase the efficiency of substrate handling, a robot arm having the ability to handle two substrates at the same time on opposed sides of a robot has been employed. For example, FIG. 1a shows a robot 2 including two pair of struts 4 and 5 having robot blades 6 and 7 mounted thereto. The struts 4 and 5 are pivotally connected to a pair of drive arms 9 which are rotated about a pivot 8. One substrate is stored on the blade 7 while the opposite blade 6 is used to retrieve a substrate from the location in which the substrate exchange is to occur. Once the processed substrate is retrieved from the processing chamber by blade 7, the robot rotates 180° and the substrate disposed on blade 6 may be placed in the processing chamber. The robot then rotates again to place the processed substrate back into the load lock chamber, a storage chamber or in another processing chamber. While this robot configuration reduces the chamber idle time by providing a substrate following the 180° rotation, it does not allow for the immediate replacement of a new substrate in a process chamber after a processed substrate is removed. Additionally, this configuration is still limited to delivering or retrieving a substrate in a single chamber on any given extension.

In another attempt to increase throughput and decrease chamber idle time associated with substrate transfer, another robot configuration provides for linked, coordinated movement of two blades 30 and 30' on separate planes as shown in FIG. 1b. Two concentric hubs 12 and 12' drive a linkage connecting blades 30 and 30' thereto. Dual plane robots can perform a shuttle operation which decreases chamber idle time. In addition, the time that the slit valve must remain open while the robot transfers a first substrate out of the chamber and inserts a second substrate into the chamber is also decreased. As a result, the throughput of the system can be increased and the period of time in which particles present outside the chamber may enter into the chamber can be decreased. However, this configuration still requires full-length strokes to accomplish insertion and retraction by each set of the robot arms to effect substrate exchange.

Another attempt to increase throughput and effect wafer exchange is illustrated in FIG. 1c and includes a blade configuration which can increase throughput by effecting substrate exchange using a single stroke and multiple positions of the robot. This linkage is described in U.S. patent application Ser. No. 08/946,920, entitled "Robot Blade With Dual Offset Wafer Supports," filed Oct. 8, 1997, which is hereby incorporated in its entirety by reference. Generally, the wafer blade defines a pair of spaced parallel wafer supporting surfaces 38 and 38' which are offset by a vertical and horizontal distance, D1 and D2 respectively, so that the upper supporting surface extends over the lower supporting surface. This offset allows lift pins disposed in a wafer support to independently access wafers supported on each of the support surfaces without any interference therebetween. Using the robot blade with the dual offset wafers supports, a wafer may be transferred from the chamber onto one of the wafer supporting surfaces and then a wafer disposed on the other wafer supporting surface may be transferred into the chamber during a single stroke of insertion and retraction by robot. The robot need only to make a small radial movement to support the second substrate supporting surface over the lift pins.

Unfortunately, the offset wafer supporting surfaces require a deeper stroke of the wafer blade into the process chamber because to align the lower support surface with the lifting pins the upper support surface must be moved further into the process chamber. In order to accommodate the deeper stroke of the wafer blade, the process chamber must be redesigned and its cavity made larger. However, redesigning the process chamber to accommodate the deeper stroke is relatively costly and may affect process uniformity or require a larger process chamber.

Thus, there remains a need for a robot having minimal parts that can perform a substrate shuttle operation with minimal movements.

SUMMARY OF THE INVENTION

The present invention generally provides a mechanical linkage for a robot which includes a pair of vertically spaced substrate supports, e.g. blades, driven by a pair of drive arms mounted to two concentric drive hubs. A pair of struts are mounted between each of the drive arms and each of the wafer supports to translate rotational motion of the drive arms into linear extension of the wafer supports.

In one aspect of the invention, the drive arms are configured to mount the pair of struts at different radii from the axis of rotation of the concentric drive hubs to provide a different rate of travel on extension of each of the substrate supports. Preferably, the drive arms are generally triangular in shape and include pivot points at each of the corners located away from the concentric drive hubs.

On rotation of the concentric drive hubs, the linkage between each of the pairs of struts and the drive arms causes the upper linkage to move at a faster rate than the lower linkage so that the upper linkage is positioned for wafer transfer within a processing chamber prior to the lower linkage being similarly situated in the chamber for wafer transfer. Upon complete extension of the both the first and second wafer supports, the linkage is also adapted to confine the support extensions of each of the blades to substantially the same position.

In another aspect of the invention, a method is provided for effecting substrate transfer within a processing system by driving two pair of struts mounting a wafer support on the ends thereof and connected to a pair of drive arms. On rotation of the drive arms, each of the linkages are sequentially delivered into the processing chamber so that wafer exchange can be effected. An upper linkage is first moved into the chamber so that a processed substrate can be placed on the upper substrate support for removal from the chamber. On continued extension, the lower blade moves over the substrate support to position a wafer disposed on the lower substrate support into the chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 2A–C are perspective views of three embodiments of the present invention.

DETAILED DESCRIPTION OF THE PREFERRED EMBODIMENT

The present invention generally provides an apparatus useful for transferring objects between locations within a processing system and for effecting wafer transfer at a location in the processing system. In general, the present invention provides an apparatus for transferring objects that includes at least one drive assembly, a pair of drive arms and two pair of struts mounted to the pair of drive arms. Each pair of struts pivotally mounts a blade, each blade having an upper surface adapted for supporting an object, such as a wafer, thereon. The drive arms are configured to include two pivot points thereon to mount the two pair of struts, each pair of struts mounted different distances from a common axis of rotation. The robot is able to sequentially position the object supporting surfaces of the blades at the same object transfer position because the blades move at different speeds and extend different lengths on rotation of the drive assembly. By delivering the object supporting surfaces sequentially to the object transfer position, objects may be exchanged to and from the blades during a single stroke of the robot into a chamber.

Although the present application is applicable to systems and apparatuses for transferring virtually any object, the present application will refer primarily to the transfer of substrates to and from a process chamber and often uses the term substrate in place of object. However, the scope of the application and invention is not limited to substrates and chambers alone, but to any object being transferred to any location using automation.

Figure 1A:
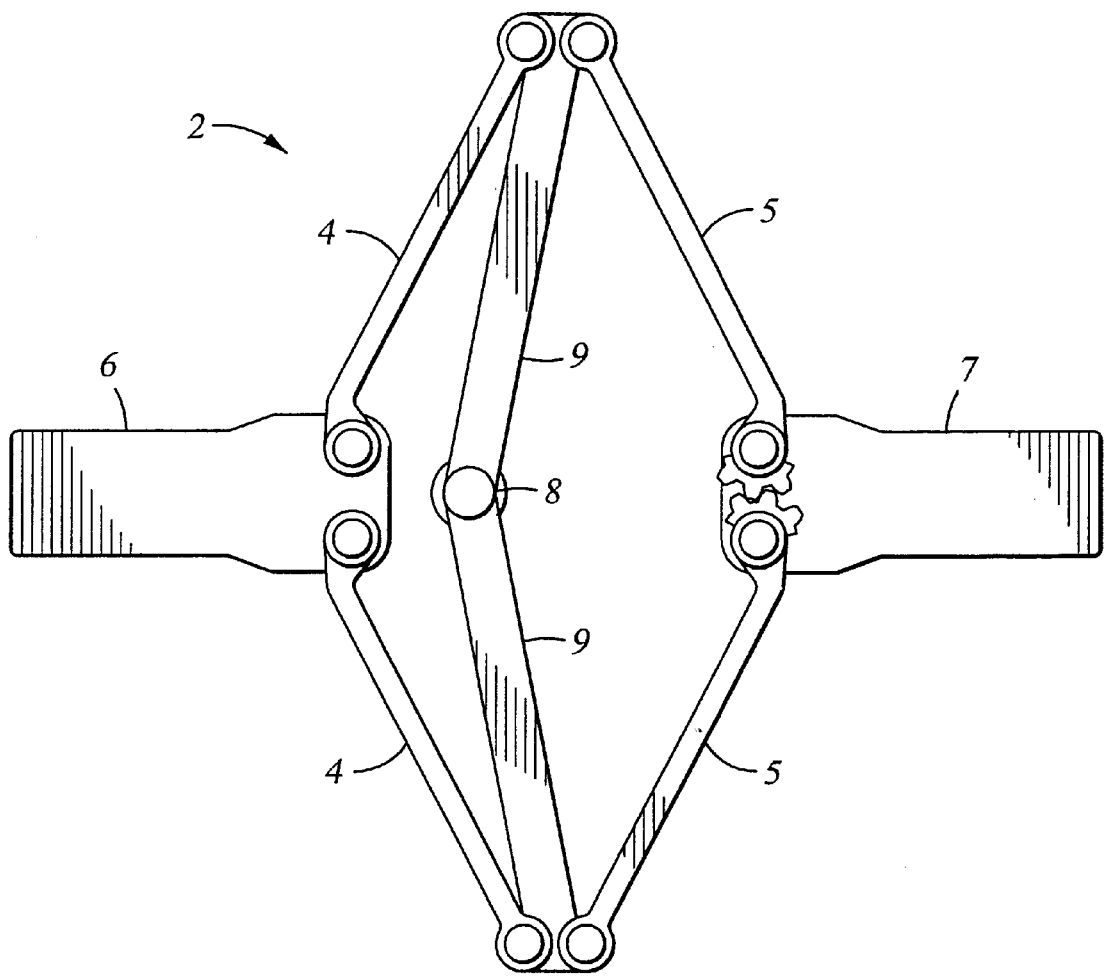
FIGS. 1A–C are schematic views of prior art robot designs having two blades.
Figure 1B:
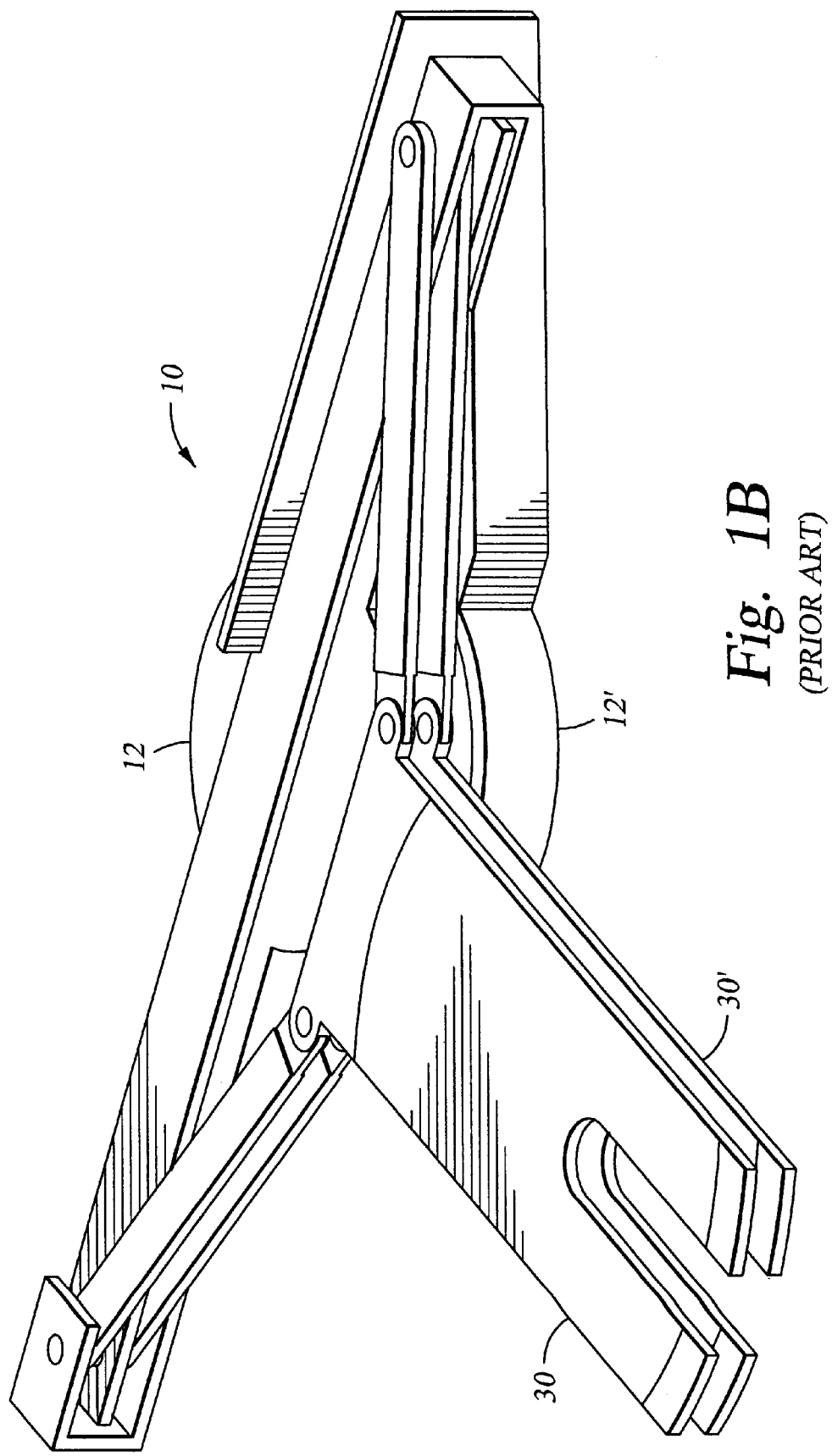
Figure 1C:
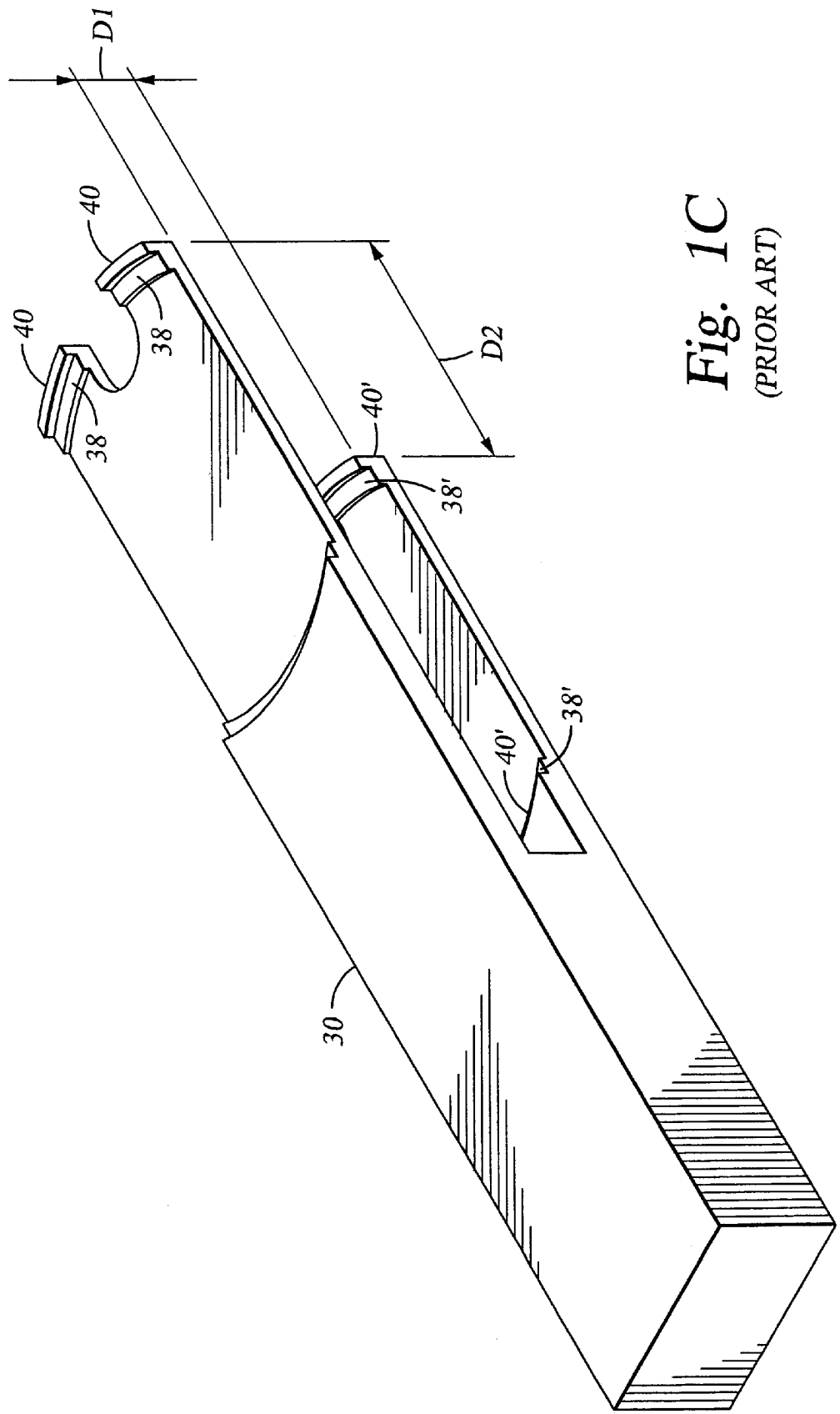
Figure 2A:
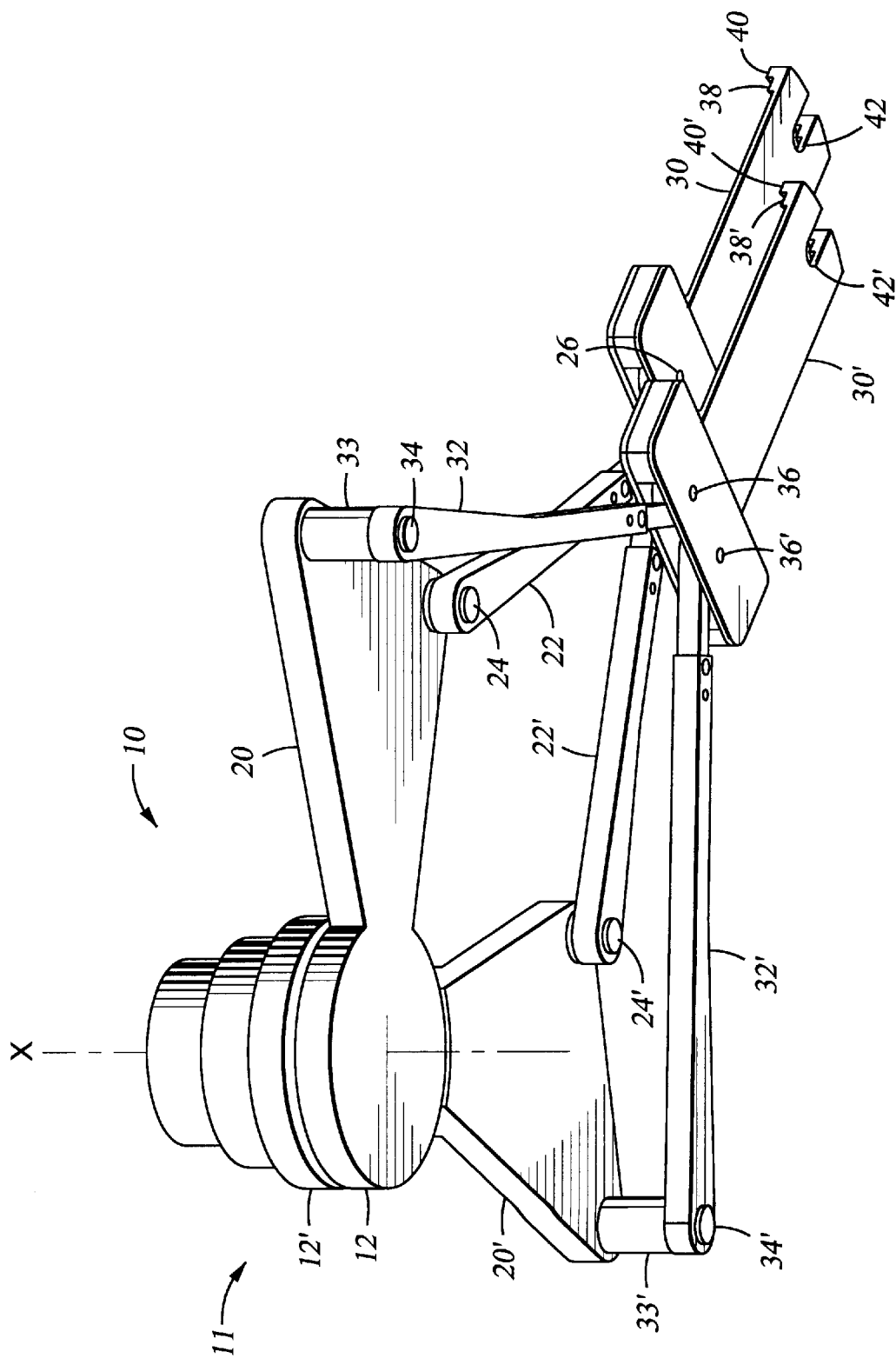
Figure 2B:
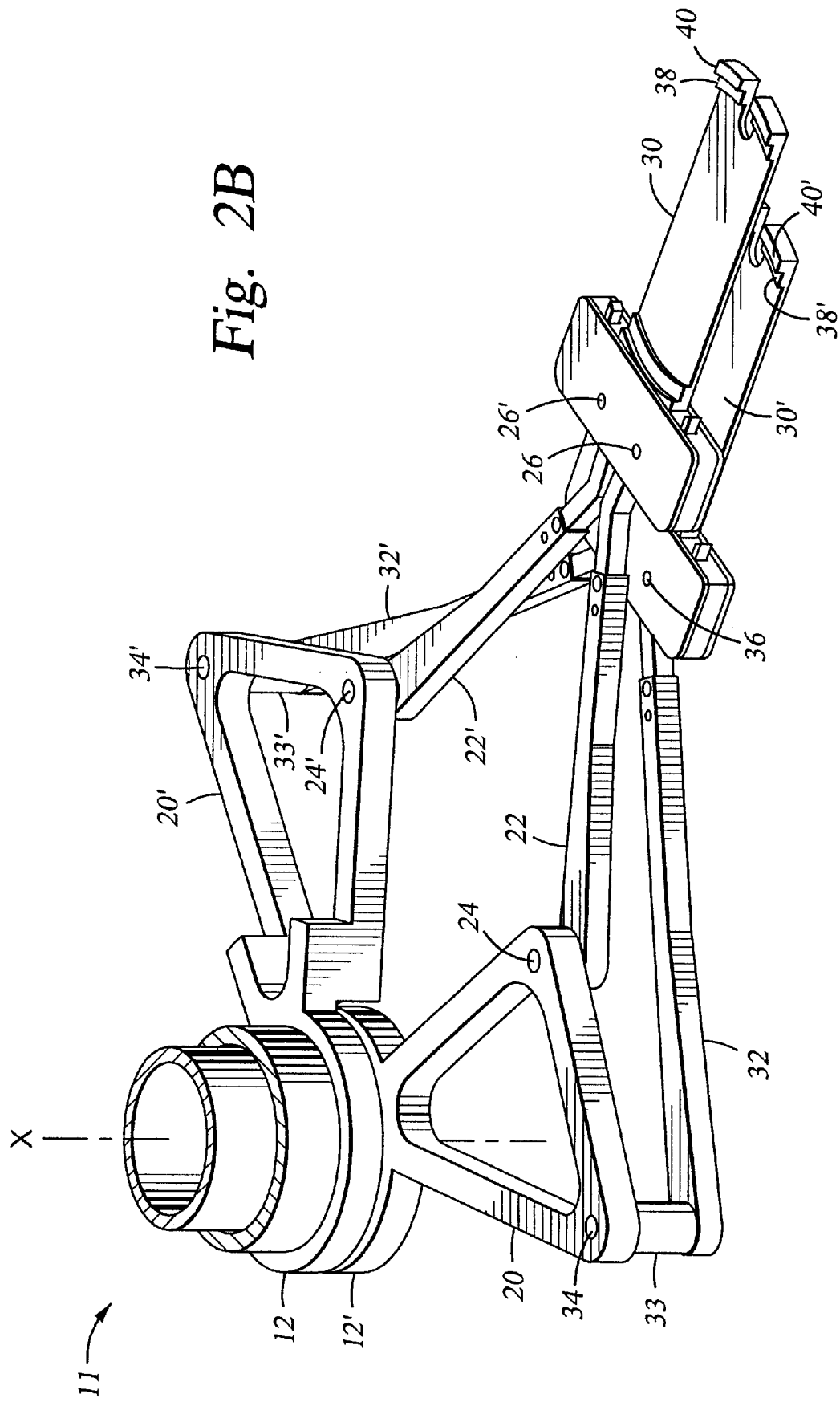

FIGS. 2A–C are perspective views of robots 10 of the present invention. The "frog-leg" type robot 10 includes two concentric hubs 12 and 12' magnetically coupled to computer-controlled drive motors for rotating the hubs about a common axis X. The movement imparted to the concentric hubs 12 and 12' is preferably accomplished through magnetic coupling which is described in U.S. Pat. No. 5,227,708, entitled "Two-Axis Magnetically Coupled Robot," issued on Jul. 13, 1993, which is hereby incorporated in its entirety by reference. Although magnetic coupling is preferred, other drive mechanisms can be used as well.

Referring to FIG. 2A, a first drive arm 20 is fixedly attached to the lower concentric hub 12 and a second drive arm 20' is fixedly attached to the upper concentric hub 12'. The first and second drive arms 20 and 20' are formed of a relatively rigid material and extend horizontally from the associated concentric hubs 12 and 12' in a cantilevered manner. Also, the first and second drive arms are preferably similar in shape to one another and are symmetrically mounted to opposing concentric hubs 12 and 12'. The drive arm 20' mounted to the upper hub 12' preferably has a vertical offset at its attachment to the hub 12' to locate the drive arm 20' in a coplanar relationship with drive arm 20. However, the drive arms 20 and 20' could be disposed on different planes using spacers to mount the struts 22' and 32'. The drive arms 20 and 20' are preferably triangular shaped to provide four pivot points 24, 24', 34 and 34' at the two corners of the drive arm opposite the corner mounted to the concentric hubs 12 and 12'. The drive arms 20 and 20' may be a solid piece as shown in FIG. 2A or may include a cut-out in the central portion to reduce the weight of each drive arm as shown in FIG. 2B. Additionally, a pair of drive arms may be mounted to each concentric hub as shown in FIG. 2C to provide the pivot points to mount four struts. The drive arms are sized and adapted to provide two separate pivot points having different radii from the axis of rotation X of the concentric hubs 12 and 12'. When moved, the drive arms 20 and 20' generally follow a circular path about the axis of rotation. The drive arms 20 and 20' are therefore adapted to accommodate the radial and lateral offset of the pivot points 24, 24', 34, and 34'.

A cantilevered first upper strut 22 is pivotally attached at one end to the first drive arm 20 at pivot point 24. Similarly, a cantilevered second upper strut 22' is pivotally attached to the second drive arm 20' at pivot point 24'. The opposite, apogee ends, 26 and 26' (shown in FIGS. 2B and 2C), of the first and second upper struts, 22 and 22', are attached to a first blade 30 so that the structure of the drive arms 20 and 20' and upper struts 22 and 22' form a frog-leg type connection between the first blade 30 and the concentric hubs 12 and 12'. The drive arms 20 and 20', the upper struts 22 and 22' and the blade 30 make up the upper linkage.

The robot 10 also includes a second blade 30' mounted in spaced parallel relationship to the first blade 30. A first lower strut 32 is attached at one end to the lower drive arm 20 at pivot point 34 and a second lower strut 32' is attached at one end to the second drive arm 20' at second pivot point 34'. The opposite, apogee ends 36 and 36' of the first and second lower struts are attached to the second blade 30' so that the structure of the drive arms 20 and 20' and the lower struts 32 and 32' form a second frog-leg type connection between the second blade 30' and the concentric hubs 12 and 12'. The lower struts 32 and 32' are disposed below the drive arms 20 and 20' on spacers 33 and 33' to locate the struts in the same plane below the upper linkage. Additionally, struts 22' and 32' could be disposed on spacers in applications where the drive arms 20 and 20' are in different planes. The drive arms 20 and 20', the lower struts 32 and 32' and the blade 30' make up the lower linkage.

The blades 30 and 30' each include an object supporting surface 38 and 38' which preferably occupy parallel planes. Each of the object supporting surfaces 38 and 38' include ridges 40 and 40' which partially outline the circumference of a substrate to hold the substrate and prevent substrate movement while the substrate is being transferred on the object supporting surfaces 38 and 38'. Preferably, ridges 40 and 40' extend above the object supporting surfaces 38 and 38' to a height approximately equal to the thickness of a substrate. The blades 30 and 30' also preferably include recesses 42 and 42' at the tip of the platform to allow lifting pins, typically disposed in a triangular configuration in a substrate support member, to access the substrate during placement or removal of a substrate from the blade. In a four-lift pin rectangular configuration, the recesses 42 and 42' may not be necessary because the width of the blade is narrower than the distance between the lifting pins so that the blade can travel between the pins. The struts 22, 22', 32, and 32' and blades 30 and 30' are preferably formed of a substantially rigid material such as aluminum.

In order to permit transfer of objects, such as a substrate in a processing system, onto and from the object supporting surfaces 38 and 38' of the blades 30 and 30', the blades must be spaced both vertically and horizontally from one another. One preferred manner of producing the desired spacing is to mount one set of struts, such as the upper struts 22 and 22', to the lower surface of the drive arms 20 and 20' and to mount the lower struts 32 and 32' on spacers 33 and 33' disposed on the lower surface of the drive arms 20 and 20'. By mounting the lower struts 32 and 32' on spacers 33 and 33', the blades 30 and 30' are vertically spaced from one another and the strut and blade assemblies are thereby prevented from contacting and interfering with one another. Alternatively, the upper struts 22 and 22' and lower struts 32 and 32' can be mounted to the bottom and top of the drive arms 20 and 20', respectively, to provide the required spacing between the upper and lower linkages.

The vertical clearance distance D1 between the underside of the upper blade 30 and the top of the clamping ridges 40 of the lower blade 30' is provided to allow free movement of the substrate, onto and off of the lower object supporting surface 38'. Preferably, the vertical clearance distance D1 is minimized as well as the thickness of the blades 30 and 30' so that the overall thickness of the blades is minimized. Minimization of the overall thickness of blades results in minimization of the size of slit valve openings required in the chambers into which the substrates are moved. The small slit valve openings reduce the probability that contaminates will be introduced into the chamber.

The pivot points 24 and 24' mounting the upper struts 22 and 22' are offset from the upper pivot points 34 and 34' mounting the lower struts 32 and 32'. Preferably, the pivot points 24 and 24' and pivot points 34 and 34' are radially offset from one another so that they follow rotational paths about the axis of rotation of the concentric hubs that have different radii. Also, the pivot points 24 and 24' and pivot points 34 and 34' are preferably laterally, or circumferentially, offset from one another. However, because the blades 30 and 30' are radially aligned with one another and must both have the same "reach" (i.e., they must both reach the object transfer position), the upper struts 22 and 22' typically have a different length than the lower struts 32 and 32'. Due to the offset of the pivot points 24 and 24' to the pivot points 34 and 34', the rotation of the first and second drive arms 20 and 20' in opposite directions moves the pivot points 24 and 24' at a different rate than the pivot points 34 and 34' which causes the struts 22 and 22' to move radially at a different rate than the struts 32 and 32' causing the first blade 30 and second blade 30' to move at different rates from one another. Accordingly, during extension or retraction, the blades 30 and 30' move at different rates which also means that the linear, radial travel distances of the first and second blades 30, 30' are different from one another during extension and retraction.

In operation, when the concentric hubs 12 and 12' rotate in the same direction with the same angular velocity, the robot 10 rotates about the axis X of the concentric hubs in this same direction with the same velocity. When the concentric hubs 12 and 12' rotate in opposite directions with the same angular velocity, there is no rotation of the robot 10, but instead there is linear, radial movement of the first and second blades 30 and 30' toward or away from the concentric hubs depending on the direction of rotation. As the drive arms 20 and 20' rotate toward one another, the struts 22, 22', 32, and 32' extend the blades 30 and 30' moving the blades linearly and radially away from the concentric hubs. Similarly, as the drive arms 20 and 20' rotate away from one another, the struts 22, 22', 32, and 32' rotate to retract the blades 30 and 30', moving the blades 30 and 30' linearly and radially toward the concentric hubs.

To keep the blades 30 and 30' directed radially away from the rotational axis, an interlocking mechanism is used between the pivots or cams at the strut to blade connection to assure an equal and opposite angular rotation of each pivot. The interlocking mechanism may take on many designs, including intermeshed gears or straps pulled around the pivots in a figure-8 pattern or the equivalent. One preferred interlocking mechanism is a pair of intermeshed gears 92 formed on the pivots 26 and 26' as shown in FIG. 9. The gears are loosely meshed to minimize particulate generation by the gears. To eliminate play between the gears because of the loose mesh, a spring 94 may be extended between a point on one gear to a point on the other gear so that the spring tension lightly rotates the gears in opposite directions until light contact between the gears is produced.

Figure 3:
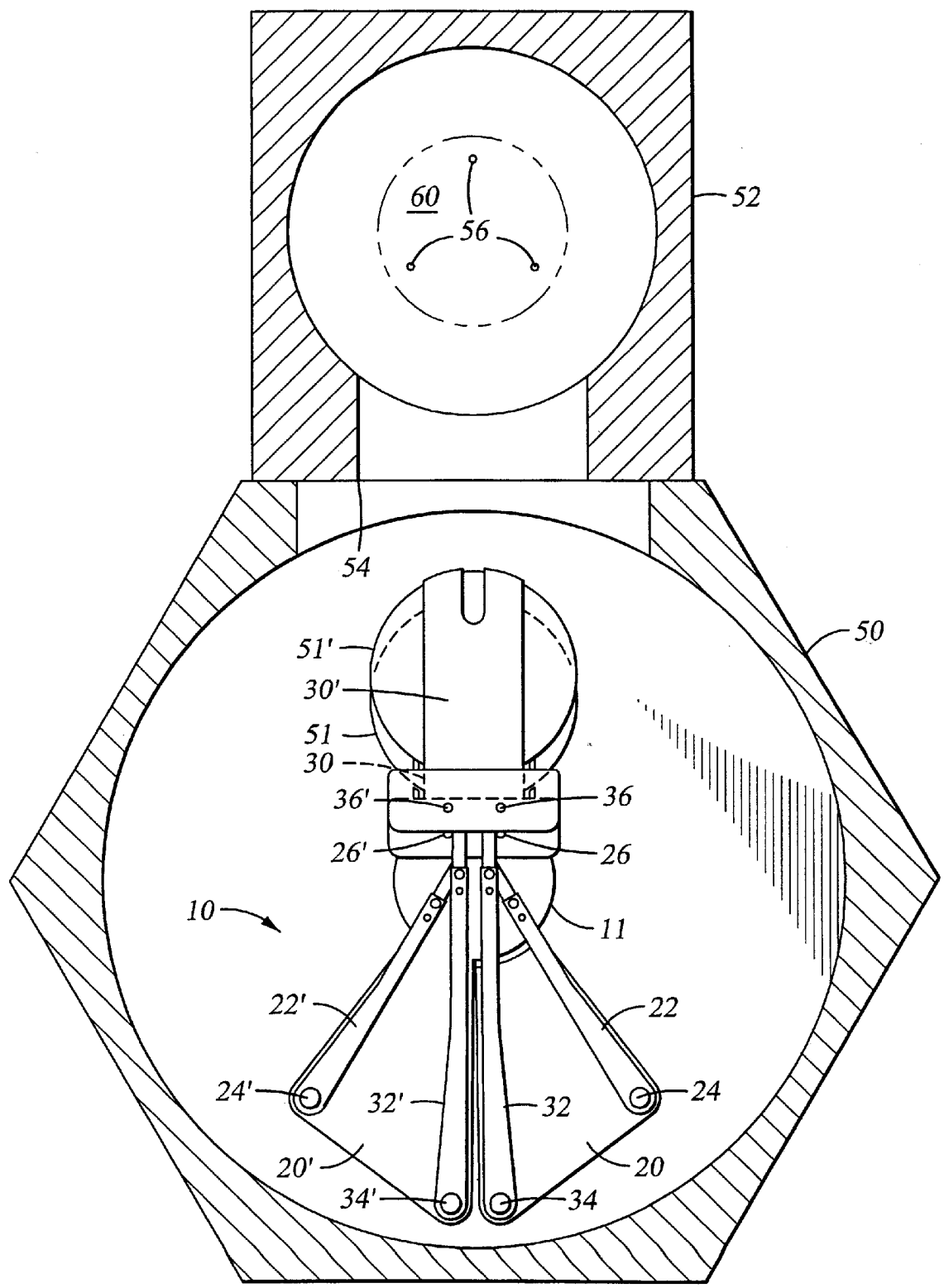
FIG. 3 is a bottom view of one embodiment of the present invention positioned in a transfer chamber and in a retracted position.
Figure 4:
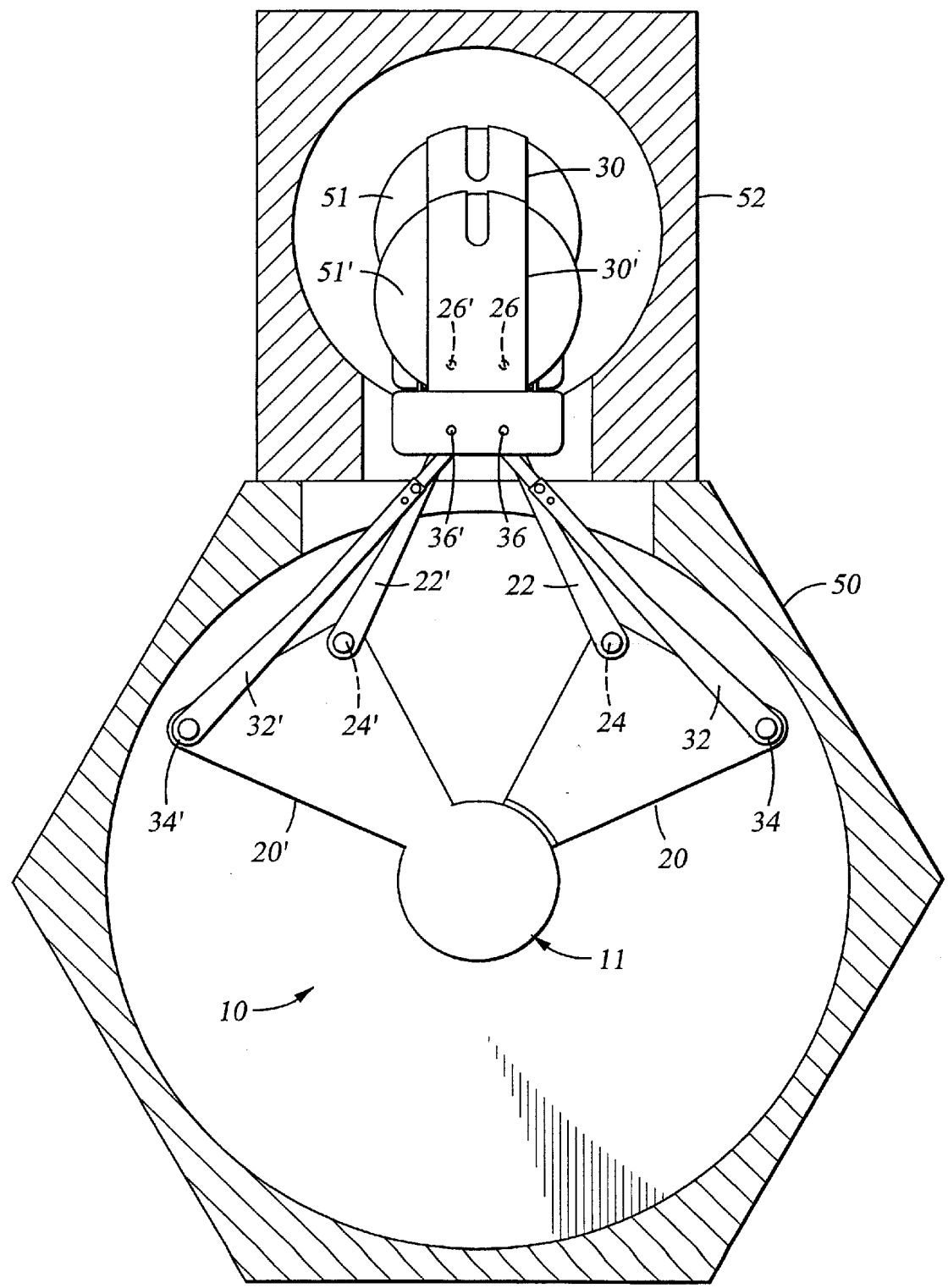
FIG. 4 is a bottom view of one embodiment of the invention positioned in a transfer chamber and in a first extended position.
Figure 5:
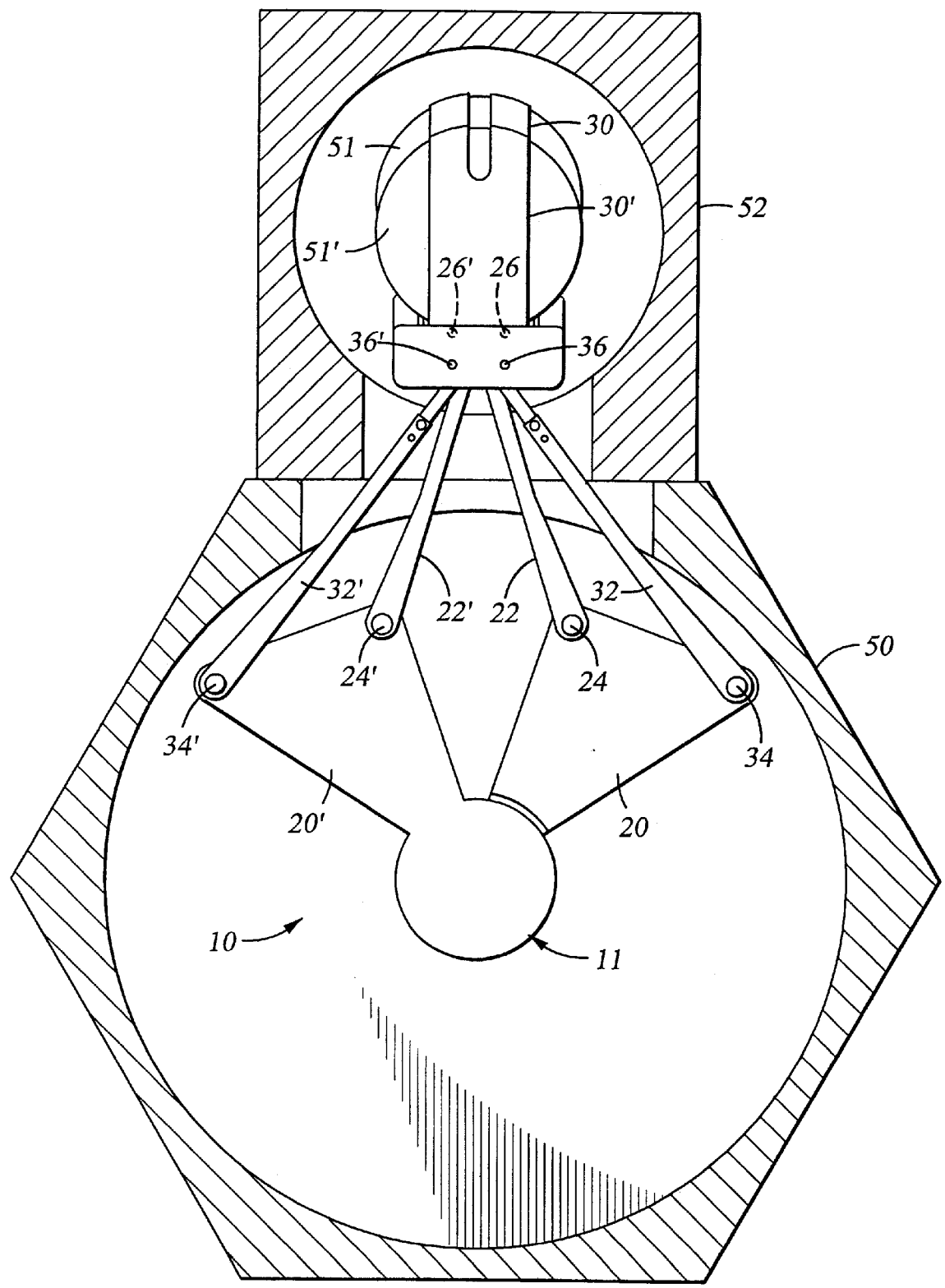
FIG. 5 is a bottom view of one embodiment of the invention positioned in a transfer chamber and in a second extended position.

FIGS. 3 through 5 are bottom elevational views of the robot 10 positioned in a transfer chamber 50 showing the progression of the sequential exchange of a pair of substrates 51 and 51', each positioned on the separate object supporting surfaces 38 and 38' of the blades 30 and 30'. FIG. 3 shows the robot 10 in the fully retracted position and the blades 30 and 30' aligned with the slit valve opening 54 of a process chamber 52 mounted to the transfer chamber 50. The object transfer position is the position of the object supporting surface 38 and 38' of the blade when the substrates 51 and 51' are positioned within the process chamber 52 vertically over a substrate support member 60 and lifting pins 56 such that the lifting pins may lift the substrate from the blade.

From the retracted position, the drive member 11 rotates the drive arms 20 and 20' in opposite directions at equal velocities toward the object transfer position forcing the struts 22, 22', 32, and 32' and blades 30 and 30' forward towards the chamber 52. As the drive arms initially move towards one another, the upper blade 30 extends at a faster rate so that the upper blade 30 reaches the substrate transfer portion over the support member 60 (shown in phantom) before the lower blade 30'.

FIG. 4 illustrates the robot 10 in the first extended position where the substrate 51 resting on the upper blade 30 is positioned over the lifting pins 56 in the process chamber 52, shown in FIG. 3. The radial displacement, or offset, of the lower blade 30' behind the upper blade 30 in the first extended position allows the lifting pins 56 of the process chamber 52 to position the substrate 51 on the upper blade 30 by moving vertically upward without contacting the substrate 51' resting on the lower blade 30'. Thus, the lifting pins 56 may place or lift a substrate on or from the upper blade 30. As previously mentioned, the radial offset of the blades 30 and 30' is provided by the offset of the pivot points 24 and 24' and the pivot points 34 and 34'.

Further rotation of the drive arms 20 and 20' toward the object transfer position moves the blades 30 and 30' from the first extended position to the second extended position where the second object supporting surface 38' and the lower blade 30' are positioned with the substrate 51' resting on the lower blade 30' in the object transfer position as shown in FIG. 5. In the second extended position, the lower blade 30' is aligned in the object transfer position with the substrate resting on the lower blade 30' positioned over the lifting pins 56 of the process chamber 52. Because the lower blade 30' is lower than the upper blade 30, the lifting pins 56 may move vertically to access the substrate 51' resting on the lower blade 30' without contacting the upper substrate 51. Also, the offset pivot points 24, 24', 34, and 34' connecting the upper and lower pair of struts to the drive arms 20 and 20' cause the blades 30 and 30' to move at different rates and, thus, to move different distances radially. Therefore, when in the second extended position the radial room needed within the process chamber 52 to accommodate the first and second blades 30 and 30' is reduced over prior designs. By reducing the required radial distance needed to accommodate the movement of the blades 30 and 30', the robot 10 may be used with conventional process chambers without requiring substantial redesign of the process chambers or the processing system as a whole.

Figure 6A:
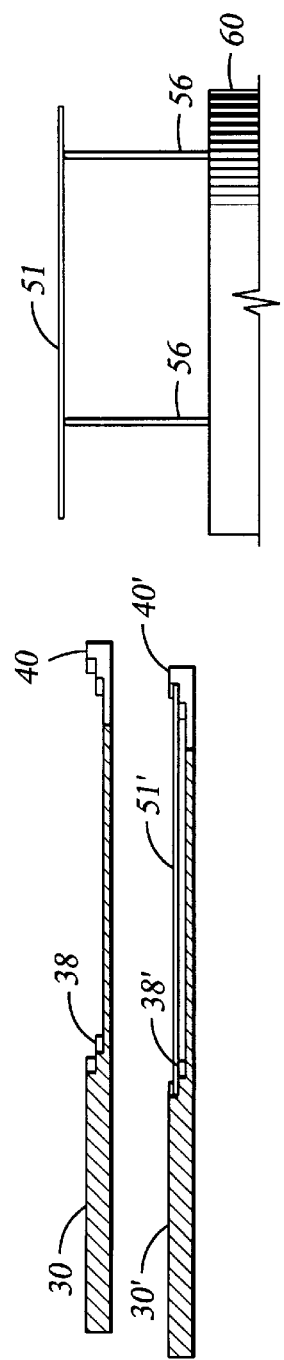
FIGS. 6A–F are partial side elevational views of the blades of the present invention illustrating a substrate transfer within a process chamber.
Figure 6B:
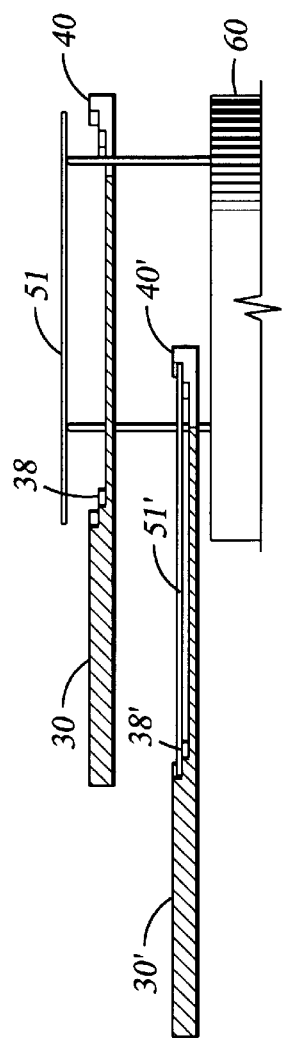
Figure 6C:
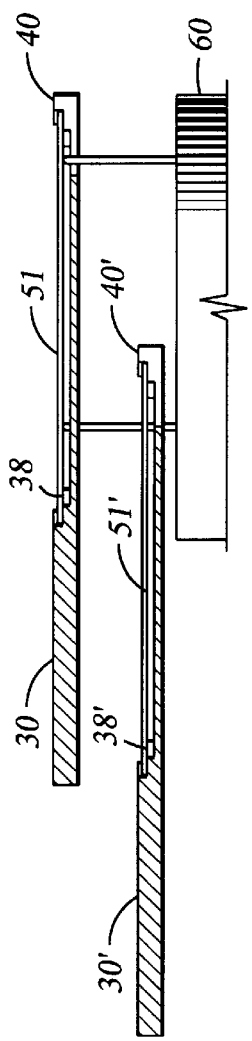
Figure 6D:
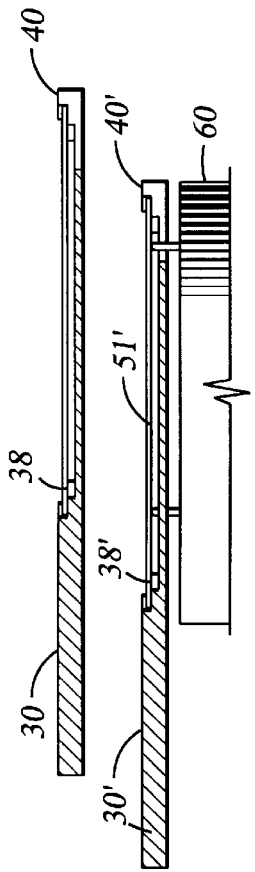
Figure 6E:
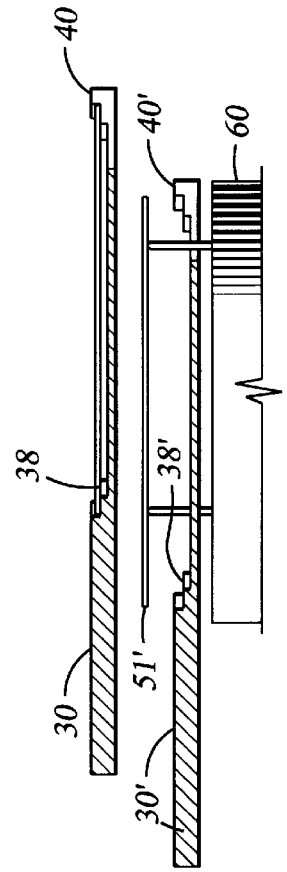
Figure 6F:
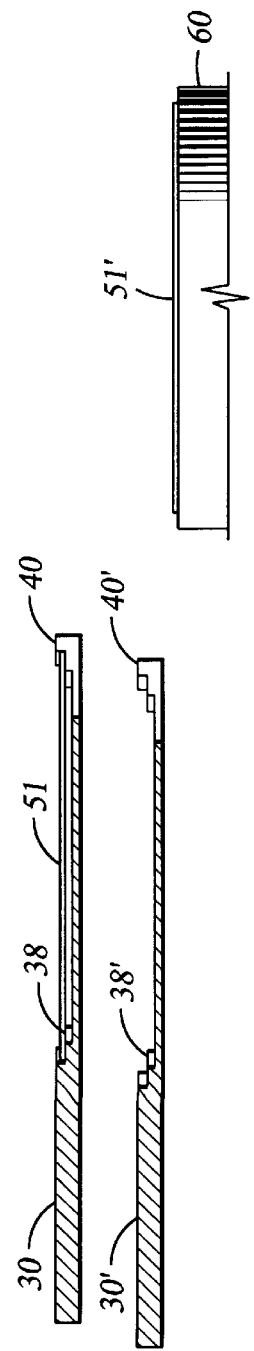
Figure 7:
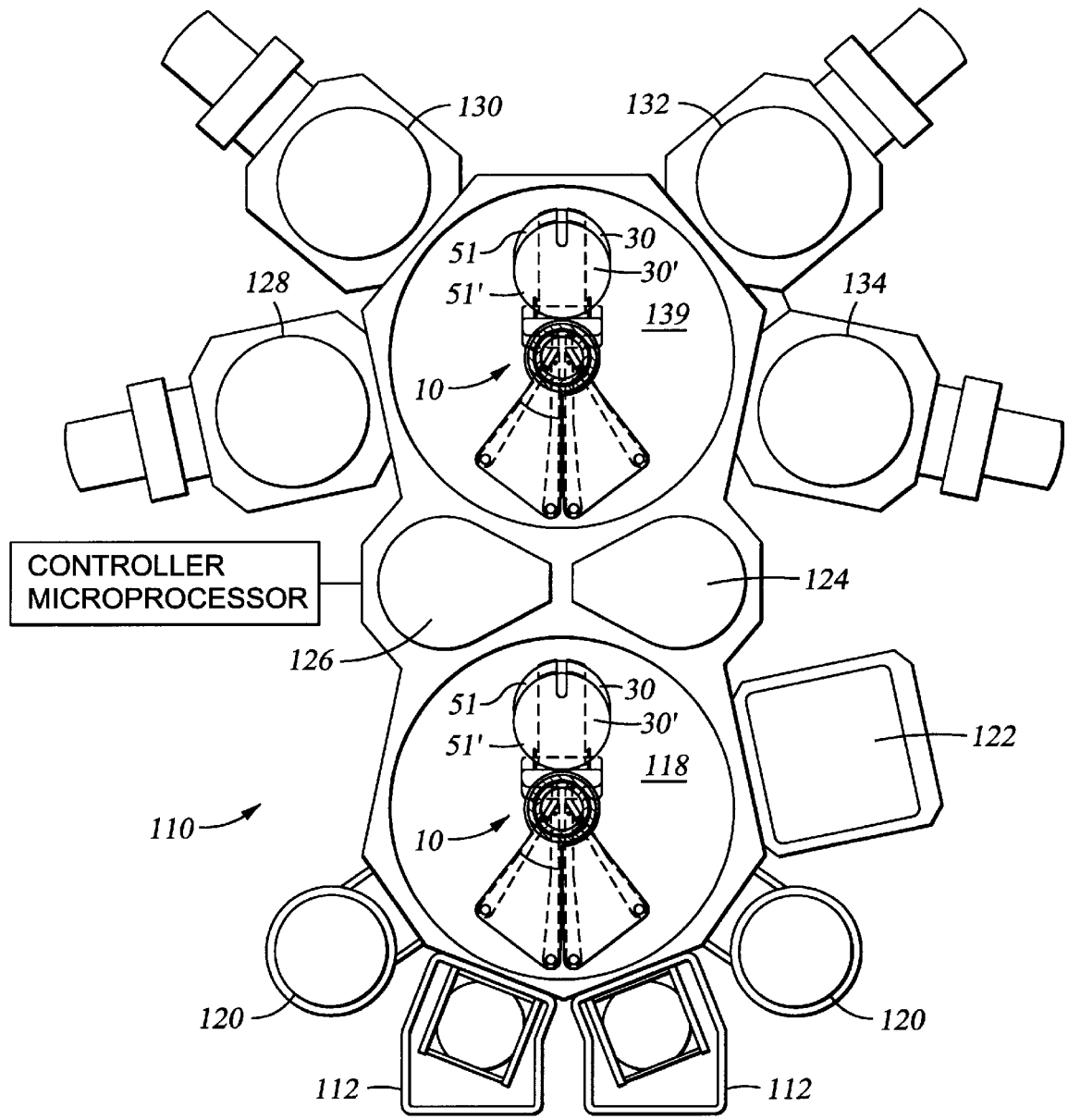
FIG. 7 is a schematic top view of a multi-chamber processing system including a robot of the present invention.

One advantage of the present invention is to provide a robot 10 that can remove a substrate 51 from a chamber 52 and introduce another substrate 51' into the chamber during a single stroke of the robot 10. FIGS. 6A through 6F are partial side elevational views showing the blades 30 and 30' moving into a chamber 52, shown in FIG. 3 and showing one possible sequence for exchanging substrates 51 and 51' within the chamber using a single stroke of the robot 10. FIG. 6A shows a processed substrate supported on lift pins 56 and a new substrate 51' supported on lower blade 30'. As the blades 30 and 30' enter the chamber as shown in FIG. 6B, the upper blade 30 is initially extended radially further than the lower blade 30'. The lifting pins 56 supporting the substrate 51 in the process chamber 52 are extended vertically to support the substrate 51 vertically higher than the upper blade 30 to permit the upper blade 30 to pass under the substrate 51. The upper blade 30 moves into the first extended position for object transfer as shown in FIG. 6C and the lifting pins 56 move downward lowering the substrate 51 onto the upper blade 30. Note that the lower blade 30' is offset behind the upper blade 30 to allow the lifting pins 56 to access the upper blade 30, though the lower blade 30' is not as far behind the upper blade 30. With the lifting pins 56 retracted below the lower blade 30', the blades extend further until the lower blade 30' is in the object transfer position as shown in FIG. 6D. When in this position, the blades 30 and 30' are radially closer due to the differential between the rates of radial movement between the blades 30 and 30' resulting from the offset pivot points 24, 24', 34, and 34', shown in FIG. 3. The clearance D1 between the first and second blades 30 and 30' is sufficient to allow the blades 30 and 30' to retract leaving the substrate 51' on the lifting pins 56 as shown in FIG. 6E. Next, the blades, 30 and 30', retract leaving the substrate 51' in the chamber 52 on lifting pins 56. The lifting pins 56 then lower the substrate 51' onto the substrate support member 60 and the transfer is complete as shown in FIG. 6F.

The present invention can be used with single robots, dual robots, dual independent robots, dual blade robots, and various other robot configurations where robot blades, 30 and 30', are generally employed. Additionally, all movements described herein are relative to positions of objects such as the robot blade, the lifting pins 56 and the pedestal. Accordingly, it is contemplated by the present invention to move any or all of the components to achieve the desired movement of substrates 51 through a processing system.

Figure 8:
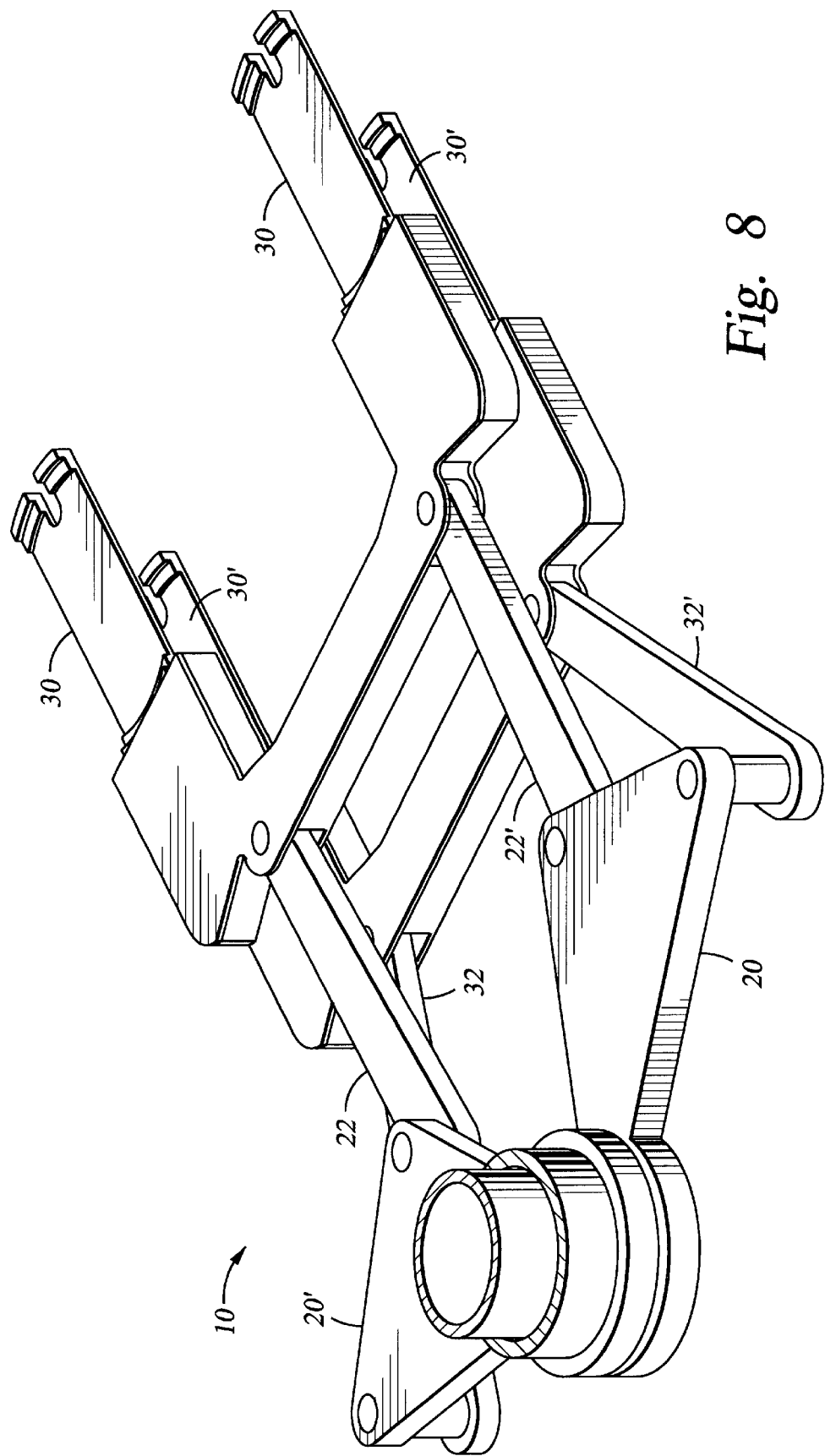
FIG. 8 is a perspective view of an alternative embodiment of the present invention for use in a dual wafer processing system.
Figure 9:
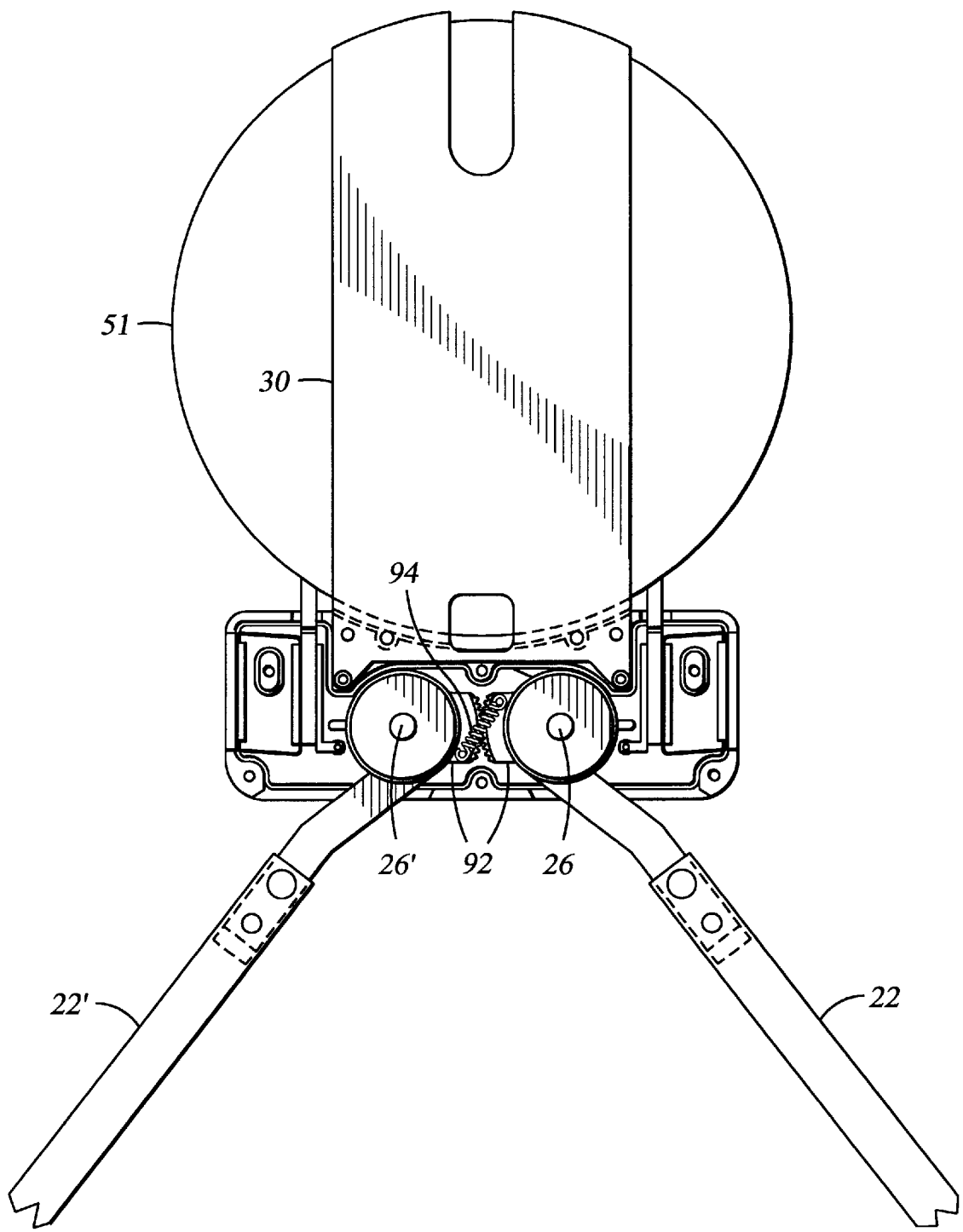
FIG. 9 is a top view of a blade with the cover plate removed.

FIG. 8 is a perspective view of the present invention as applied to a robot 10 having dual blades, 30 and 30', for use in a dual substrate processing system. The robot 10 shown in FIG. 8 is essentially the same as that previously described except each horizontal linkage mounts two dual substrate blades, 30 and 30'. Thus, the robot 10 is capable of exchanging substrates 51, 51' between two process chambers, or other chambers, positioned side by side using a single stroke of the robot 10.

While the foregoing is directed to the preferred embodiment of the present invention, other and further embodiments of the invention may be devised without departing from the basic scope thereof, and the scope thereof is determined by the claims which follow.

What is claimed is:

1. An apparatus for transferring objects, comprising:
    a drive assembly coupled to at least a first and a second drive arm and comprising at least two concentric rotatable hubs having a common axis of rotation and driven by one or more actuators, each rotatable hub mounting at least one drive arm; and
    two pair of struts, each pair of struts mounted a different distance from the common axis of rotation and each pair having a first and a second strut, the first strut of each pair being pivotally mounted to the first drive arm and the second strut of each pair being mounted to the second drive arm, each drive arm comprising a first and a second mount for connecting a strut of each pair of struts to the drive arm;
    each pair of struts mounting an object support.

2. The apparatus of claim 1 wherein each drive arm comprises a pair of arms mounted to each rotatable hub.

3. The apparatus of claim 1 wherein the object supports are spaced vertically a sufficient distance to permit transfer of an object to and from each of the object supports.

4. The apparatus of claim 3 wherein the object supports are disposed in parallel, horizontal planes.

5. An apparatus for transferring objects, comprising:
a drive assembly coupled to at least a first and a second drive arm; and
two pair of struts, each pair having a first and a second strut, the first strut of each pair being pivotally mounted to the first drive arm and the second strut of each pair being mounted to the second drive arm;
each pair of struts and the drive arms comprising a first and a second linkage which mounts an object support wherein the second pair of struts is longer than the first pair of struts.

6. The apparatus of claim 5 wherein each drive arm further comprises two strut connections for one strut of each pair of struts located at different lengths from the drive assembly.

7. An apparatus for transferring objects, comprising:
a first linkage comprising a first and second strut, the first and second strut mounting a first object support, the struts of the first linkage having a first length;
a second linkage comprising a first and second strut, the first and second strut mounting a second object support, the struts of the second linkage having a different second length than the struts of the first linkage; and
a drive assembly coupled to the first and second linkages to impart motion thereto, the drive assembly comprising a first and a second rotatable hub coupled to one or more actuators, the hubs being concentric about a common axis of rotation wherein the first strut of each linkage is coupled to the first rotatable hub and the second strut of each linkage is coupled to the second rotatable hub and each linkage is symmetrically coupled to the rotatable hubs to define a first and a second arc of each connection.

8. The apparatus of claim 7 wherein the struts of the first linkage are shorter than the struts of the second linkage.

9. A process system, comprising:
a transfer chamber;
a plurality of process chambers connected to the transfer chamber;
a robot disposed within the transfer chamber, comprising:
a drive assembly coupled to at least a first and a second drive arm, the drive assembly comprising at least two rotatable hubs driven by one or more actuators and concentric about a common axis of rotation, each rotatable hub mounting least one drive arm; and
two pair of struts, each pair having a first and a second strut, the first strut of each pair being pivotally mounted to the first drive arm and the second strut of each pair being mounted to the second drive arm, each drive arm comprising a first and a second mount for connecting a strut of each pair of struts to the drive arm; and
each pair of struts mounting an object support vertically spaced from each other and each pair of struts being mounted a different distance from the common axis of rotation.

10. The system of claim 8 wherein each drive arm comprises a pair of arms mounted to each rotatable hub.

11. The system of claim 9 wherein the object supports are spaced vertically a sufficient distance to permit transfer of an object to and from each of the object supports.

12. The system of claim 11 wherein the object supports are disposed in parallel, horizontal planes.

13. A process system, comprising:
a transfer chamber;
a plurality of process chambers connected to the transfer chamber;
a robot disposed within the transfer chamber, comprising:
a drive assembly coupled to at least a first and a second drive arm; and
two pair of struts, each pair having a first and a second strut, the first strut of each pair being pivotally mounted to the first drive arm and the second strut of each pair being mounted to the second drive arm, the second pair of struts being longer than the first pair of struts; and
each pair of struts and the drive arms comprising a first and a second linkage which mounts an object support vertically spaced from each other.

14. The system of claim 13 wherein each drive arm further comprises two strut connections for one strut of each pair of struts located at different lengths from the drive assembly.

15. A process system, comprising:
a transfer chamber;
a plurality of process chambers connected to the transfer chamber;
a robot disposed within the transfer chamber, comprising:
a drive assembly coupled to at least a first and a second drive arm and comprising at least two concentric rotatable hubs having a common axis of rotation and driven by one or more actuators, each rotatable hub mounting at least one drive arm; and
two pair of struts, each pair of struts mounted a different distance from the common axis of rotation and each pair having a first and a second strut, the first strut of each pair being pivotally mounted to the first drive arm and the second strut of each pair being mounted to the second drive arm, each drive arm comprising a first and a second mount for connecting a strut of each pair of struts to the drive arm;
each pair of struts mounting an object support.

16. A process system, comprising:
a transfer chamber;
a plurality of process chambers connected to the transfer chamber;
a robot disposed within the transfer chamber, comprising:
a drive assembly coupled to at least a first and a second drive arm; and
two pair of struts, each pair having a first and a second strut, the first strut of each pair being pivotally mounted to the first drive arm and the second strut of each pair being mounted to the second drive arm;
each pair of struts and the drive arms comprising a first and a second linkage which mounts an object support, one pair of struts being longer than the other pair of struts.

* * * * *